United States Patent [19]
Cline et al.

[11] 3,956,023
[45] May 11, 1976

[54] PROCESS FOR MAKING A DEEP POWER DIODE BY THERMAL MIGRATION OF DOPANT

[75] Inventors: Harvey E. Cline; Thomas R. Anthony, both of Schenectady, N.Y.

[73] Assignee: General Electric Company, Schenectady, N.Y.

[22] Filed: Oct. 30, 1974

[21] Appl. No.: 519,249

Related U.S. Application Data

[63] Continuation-in-part of Ser. No. 411,001, Oct. 30, 1973, abandoned.

[52] U.S. Cl. ............................... 148/1.5; 148/171; 148/172; 148/186; 148/175; 252/62.3 GA; 252/62.3 E; 252/62.3 ZT
[51] Int. Cl.² ........................................... H01L 7/36
[58] Field of Search ... 148/171–173, 1.5, 186–188, 148/175; 252/62.3 GA, 62.3 E, 62.3 ZT

[56] References Cited
UNITED STATES PATENTS

| | | | |
|---|---|---|---|
| 2,813,048 | 11/1957 | Pfann | 148/1 |
| 3,484,302 | 12/1969 | Maeda et al. | 148/171 X |

*Primary Examiner*—G. Ozaki
*Attorney, Agent, or Firm*—Donald M. Winegar; Joseph T. Cohen; Jerome C. Squillaro

[57] ABSTRACT

A semiconductor diode comprises a first body of semiconductor material having a selected resistivity and a first type conductivity and a region of second type conductivity and a selected resistivity. The second body consists of recrystallized semiconductor material of a layer thereof having solid solubility of a dopant therein and has the same crystallographic structure as the first body. The second region is formed by a temperature gradient zone melting process embodying the migration of a metal-enriched melt of semiconductor material through the second body of semiconductor material. Preferably, the metal-enriched melt is no greater than approximately 20 microns in thickness. The second body initially has a < 111 > axial crystallographic orientation when it is a wafer. However, the second body initially may be polycrystalline semiconductor material.

45 Claims, 12 Drawing Figures

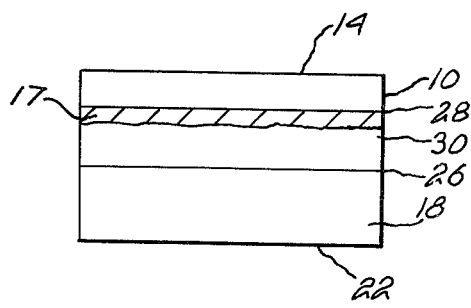
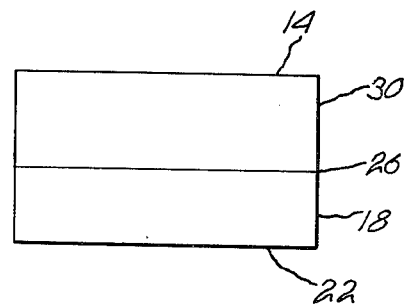
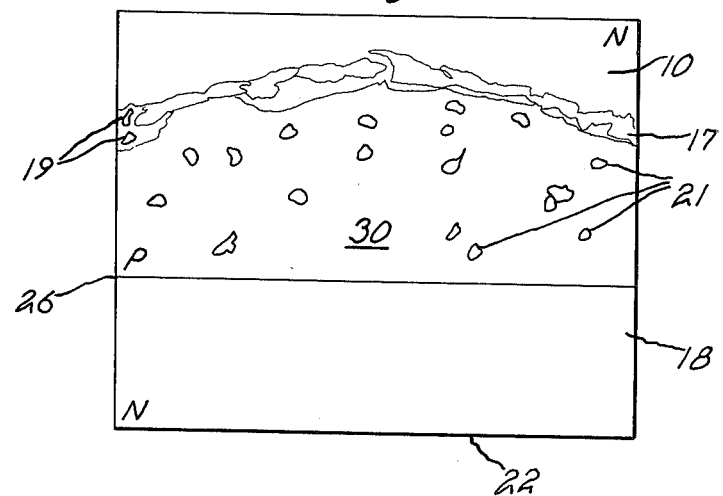
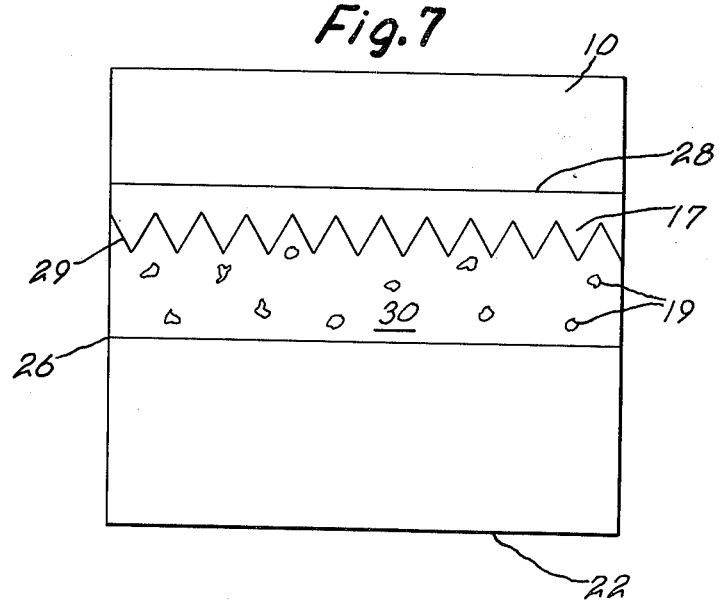

PROCESS FOR MAKING A DEEP POWER DIODE BY THERMAL MIGRATION OF DOPANT

CROSS-REFERENCE TO RELATED PATENT APPLICATION

This invention is a Continuation-In-Part of our U.S. Pat. application, Ser. No. 411,001, filed Oct. 30, 1973, and assigned to the same assignee as the present invention and now abandoned.

BACKGROUND OF THE INVENTION

1. Field of the Invention

This invention relates to semiconductor power diodes and a temperature gradient zone melting process for making the same.

2. Description of the Prior Art

Heretofore, commercial semiconductor diodes have been made by diffusion, alloying or epitaxial growth techniques. All such processes involve procedures wherein the optimum physical characteristics of the diodes are never achieved. Procedures are such that the introduction of contaminants inherent with the process techniques practiced degrade the physical characteristics of the diodes manufactured.

W. G. Pfann in his U.S. Pat. No. 2,813,048, teaches thermal gradient zone melting techniques for making various semiconductor devices. However, Pfann's devices had too many deficiencies to enable the process to be employed commercially.

An object of this invention is to provide a new and improved semiconductor power diode, the structure of which overcomes the deficiencies of the prior art.

Another object of this invention is to provide a new and improved semiconductor power diode which has maximum theoretical breakdown voltage as determined by the materials embodied therein.

Another object of this invention is to provide a new and improved semiconductor power diode which has a sharper P-N junction profile than any P-N junctions in prior art devices.

A further object of this invention is to provide a new and improved semiconductor power diode which has a faster recovery time and better switching characteristics than the prior art power diode devices.

A still further object of this invention is to provide a temperature gradient zone melting process to made a new and improved semiconductor power diode which is substantially free of defects such, for example, as metallic inclusions.

Other objects of this invention will, in part, be obvious and will, in part, appear hereinafter.

BRIEF DESCRIPTION OF THE INVENTION

In accordance with the teachings of this invention, there is provided a semiconductor diode comprising a plurality of integral individual bodies of single crystal semiconductor material. Each body has a pair of opposed major surfaces substantially parallel to each other, a selected type conductivity, a selected resistivity and a selected crystallographic structure. The material of each of (N-1) bodies, wherein N is a positive integer of 2 or greater, is recrystallized semiconductor material of the respective bodies having solid solubility of a dopant impurity metal thereon to impart the selected type conductivity and selected resistivity thereto. The concentrations level of the dopant impurity level is substantially constant throughout the respective body and the material thereof is substantially free of defects. At least one major surface of each Nth body has a crystallographic planar orientation of $<111>$. The integral bodies are so arranged that the major opposed surfaces of all the bodies are parallel to each other and at least one of the major surfaces of each body is in an abutting contact relationship with only one major surface of the next adjacent body. The bodies are bonded to and made integral with each other by a region of recrystallized material of the body in abutting contact therewith. The region being integral with the materials of the bodies has solid solubility of the dopant impurity material of at least one of the bodies of recrystallized material.

Temperature gradient zone melting is utilized to make the power diode of this invention. A layer of metal which is or includes a dopant material, and is no greater in thickness than about 10 microns, is vapor deposited on a body of semiconductor material. The material is one selected from the group consisting of silicon, silicon carbide, gallium arsenide, germanium and the group III-V and II-VI semiconductor compounds, having a $<111>$ crystallographic orientation. A second body of the same type of semiconductor is placed in abutting contact with the metal layer deposited on the first body to form a semiconductor-metal-semiconductor sandwich. A temperature gradient is effected in the sandwich and the metal layer is migrated through half of semiconductor sandwich to form the recrystallized region. Preferably, the metal layer, or melt, is no greater than about 10 microns in thickness.

An alternate temperature gradient zone melting process embodies disposing a metal layer comprising the dopant material on a surface of a body of semiconductor material. A layer of semiconductor material is then deposited on the metal layer. A temperature gradient is established and the metal layer is migrated through the deposited layer of semiconductor material by temperature gradient zone melting to form the basic power diode structure.

DESCRIPTION OF THE DRAWINGS

FIGS. 4, 5, 6, 7 and 8 are elevation views, in cross-section, of the bodies of semiconductor material of FIGS. 1 and 2 being processed further in accordance with the teachings of this invention;

DESCRIPTION OF THE INVENTION

Figure 1:
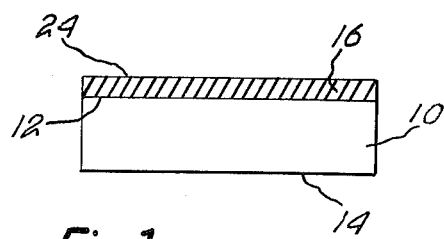
FIGS. 1 and 2 are elevation views, in cross-section, of bodies of semiconductor material being processed in accordance with the teachings of this invention.

Referring now to FIG. 1, there is shown a first body 10 of single crystal semiconductor material having a first type conductivity and a preferred resistivity. The body 10 has a top surface 12 and a bottom surface 14 which are two major surfaces substantially parallel to each other. The resistivity of the material comprising the body 10 varies with the requirement for the desired breakdown voltage of the device to be built. The body 10 has a preferred planar (111) crystallographic structure for the orientation of its surfaces 12 and 14. This preferred (111) planar crystallographic structure of the surfaces is required to enable the liquid metal to maintain a substantially uniform front which advances forward through the body 10 during a temperature gradient zone melting process employed in this invention. It has been discovered that the migration of the liquid melt, that is the metal composition of semiconductor material and the material deposited on the surface, must be in a direction normal to the natural solid-liquid (111) facet plane of the semiconductor metal liquid system. Thus the planar zone is bounded by the (111) facet plane. If the migration proceeds oblique to the (111) facet plane, then the liquid melt zone becomes unstable and breaks up into droplets. Any droplet which become entrapped in the body 10 upon completion of migration results in defects such, for example, as stressed solid metallic inclusions, which affect the physical and operating characteristics of the diode by inducing strain and stresses in body 10. Any objects imbedded in the P-N junction results in current leakage and degradation of the electrical characteristics of the device. Suitable materials for comprising the body 10 are silicon, silicon carbide, gallium arsenide, germanium, compounds of a Group II element and a Group VI element and compounds of a Group III element and a Group V element.

In order to describe the invention more fully, the body 10 will be described as being of silicon semiconductor material.

The body 10 of silicon is prepared in the customary way of all semiconductor materials for metal vapor deposition by such suitable process means as griding, polishing, lapping, and chemical polishing to remove damaged layers of semiconductor material. The process of preparing the body 10, including the aforementioned process steps, which are not shown, is not described in detail for such processing and treatment of the body 10 is well known in the art and is not pertinent to the invention herein.

A layer 16 of a suitable metal is deposited on the top surface 12 of the body 10. The material of the metal layer 16 is one that will suitably dope the material of the body 10 to produce a second and opposite type conductivity in the body 10. The thickness of the layer 16 is such that when the material of the layer 16 forms a melt of liquid metal and semiconductor material, the thickness of the melt is no greater than about 10 microns. In order to describe the invention more particularly, the body 10 is said to be of N-type conductivity. The layer 16 will then be of a suitable material such, for example, as aluminum, to produce the second, and opposite type conductivity, P-type conductivity, in the body 10. The layer 16 of aluminum is deposited by any suitable means known to those skilled in the art such, for example, hot filament vacuum deposition, electron-beam deposition and the like, which will produce a substantially oxygen-free deposit of metal for the temperature gradient zone melting process to be practiced. The metal layer must be uniformly defect free and clean to avoid wetting problems and inclusions which result in unstable migration. A deposited thin film is superior to metal foil material because with a deposited film a clean, adherent, intimate and uniform contact to the semiconductor body is formed that is free of foreign inclusions, bubbles and areas of noncontact.

The layer 16 of metal must be thick enough to cover the entire surface 12 with metal. Normally, a thickness of no less than 1 micron has been discovered to be adequate to assure complete coverage of the surface 12. However, the layer 16 should not be greater than approximately 20 microns in thickness. It has been discovered that when the layer 16 exceeds 20 microns in thickness, the melt zone which is migrated through the body 10 also exceeds 20 microns in thickness. When the thickness of the melt zone exceeds about 20 microns, the melt zone encounters intrinsic instability created by thermal and mass transport conditions and the zone becomes unstable at the solidifying solid-liquid interface.

Figure 2:
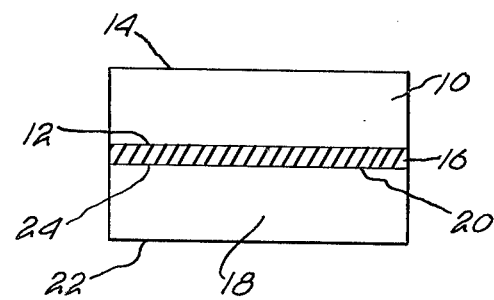

With reference to FIG. 2, a second body 18 of silicon single crystal semiconductor material of N-type conductivity and a selected resistivity is prepared in the same manner as the first body 10. The second body 18 has a top surface 20 and a bottom surface 22 which are two major surfaces substantially parallel to each other. The second body 18 of silicon may have any of the crystallographic structures which are inherent of silicon material. Preferably, however, to avoid confusion in making a large area power diode, the second body 18 of silicon also has a (111) planar crystallographic structure for the surface 20 and 22. It is to be noted that body 18 is preferably of the same material as the body 10.

A sandwich of the two processed silicon bodies 10 and 18 is prepared. The first body 10 is disposed on the second body 18 and so oriented that the exposed major surface 24 of the layer 16 of aluminum is disposed on, and in physical contact with the top surface 20 of the second body 18 of silicon.

The prepared sandwich is placed in an apparatus suitable for producing a thermal gradient substantially coinciding with the vertical axis of the bodies 10 and 18 between the two surfaces 14 and 22. The thermal gradient is therefore substantially aligned with the $<111>$ axis of the body 10. The bottom surface 14 of the first body 10 of silicon is oriented so as to be exposed to a source of thermal energy wherein the temperature is higher than that to which the bottom surface 22 of the body 18 of silicon is exposed. A temperature gradient zone melting (TGZM) process is practiced to produce a large area power diode. A temperature gradient of from 10°C per centimeter to 200°C per centimeter is maintained in the bulk of silicon material during the migration of the layer 16 of aluminum through the body 10. Preferably, the temperature gradient is maintained at a calculated temperature gradient of 100°C/cm in the bulk of silicon comprising the sandwich. The calculated temperature gradient $T_s$ is derived from the equation:

$$K_s \nabla T_s = E \sigma T_c^4$$

where
$K_s$ is the thermal conductivity of the semiconductor material-silicon
$E$ is the emissivity of the semi-conductor material-silicon.
$\sigma$ is the Stefan-Boltzman Radiation constant.
$T_c$ is the temperature of the cold face of the body of semiconductor material-silicon.

$\nabla T_s$ is the temperature gradient in the body of the semiconductor material.

The temperature gradient zone melting (TGZM) process may be carried out at a pressure ranging from approximately $1 \times 10^{-7}$ torr to approximately $1 \times 10^{-5}$ torr. Alternately, the process may also be practiced at atmospheric pressure embodying a suitable source of radiant energy.

Figure 3:
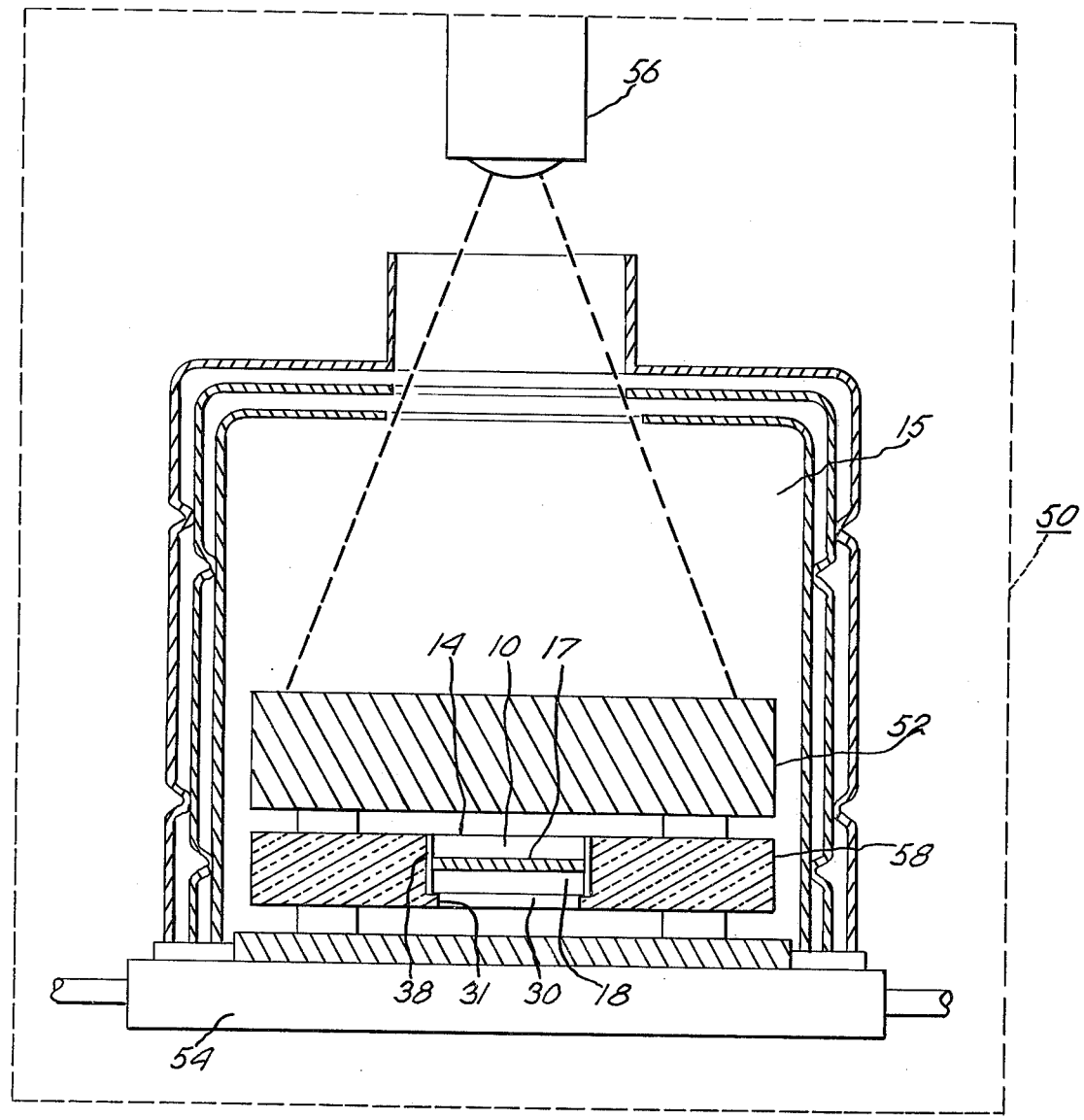
FIG. 3 is an elevation view, partly in cross-section, of apparatus suitable for practicing the process of this invention.

A schematic of a suitable vacuum furnace apparatus 50 for the temperature gradient zone melting process of this invention is shown in FIG. 3. The processed sandwich of FIG. 2 is disposed between a hot source 52 and a cold source 54. The hot source may, for example, be a block of molybdenum suitably heated by a source 56 of thermal energy such, for example, as an electron beam. It is essential that the hot source 52 uniformly heat the bottom surface 14 of the body 10 to a temperature of from 700°C to 1400°C to achieve the range of calculated temperature gradient of from 50°C per centimeter to 200°C per centimeter. The cold source 54 may, for example, be a water-cooled copper block. When the cold source 54 is a water-cooled block maintained at from 25°C to 50°C and the top surface 14 of the body 10 is uniformly heated to 1000°C ± 20°C the calculated temperature gradient is 100°C per centimeter for the bulk of silicon material through which the aluminum layer 14 is to be migrated. Radiation shields 58 are provided about the processed sandwich and the hot and cold sources 52 and 54 respectively to prevent excessive loss of heat or possible influence on the thermal gradient in the bodies 10 and 18 during the TGZM process. In particular, the radiation shields prevent thermal energy from being transported to or from the sides of the sandwich.

Referring now to FIGS. 3 and 4 initially, upon being heated to the operating temperature for the temperature gradient zone melting process, the layer 16 (FIG. 2) of aluminum becomes molten and alloys with the immediately adjacent silicon material of the top surfaces 12 and 20 of the respective bodies 10 and 18 to produce a continuous molten interface of aluminum-rich silicon. The molten interface continues to increase in size until a pool of aluminum-rich silicon liquid 17, preferably no greater than about 20 microns in thickness, is formed between the two bodies 10 and 18. As a result of the temperature gradient, the pool of aluminum-rich silicon liquid 17 begins to migrate up through the body 10 from the top surface 12 thereof towards the bottom surface 14. Aluminum-doped recrystallized silicon 30 of the body 10 and that of the top surface 20 of the body 18 is deposited beginning at the interface of the layer 16 and the body 18 thereby creating a P-N junction 26. The migration of the aluminum-rich silicon liquid upward through the body 10 is accomplished by establishing and maintaining the aforementioned finite thermal gradient in a first direction substantially parallel to the vertical axis of the sandwich. Coextensively in time, a second or zero temperature gradient is established and maintained in the sandwich in a second direction which is normal to the first direction through the assistance of the radiation shields 58 of the apparatus 50. The interface 28 between the aluminum-rich silicon liquid 17 and the silicon of the body 10 is a large liquid area in the silicon body 10 having a (111) planar crystallographic structure and a $<111>$ migration direction and migrates as a substantially continuous planar surface. Examination of the front as it migrates up through the body reveals it to be continuous throughout its expanse. As long as the thermal gradient is maintained, the molten pool of aluminum-rich silicon 17 continues to migrate upward through the body 10 continually creating a new molten zone of aluminum and silicon at its front interface 28 and depositing an aluminum doped recrystallized silicon region 30 of ever increasing size. The recrystallized region 30 has a solid solubility of the dopant impurity therein which imparts the conductivity type and selected level of resistivity to the region 30. Because the temperature gradient across the thickness of the body 10 is small, and the slope of the solid solubility curve for aluminum in silicon is small in the temperature range in which the temperature gradient zone melting is practiced, the dopant concentration and the resistivity throughout the recrystallized region 30 is substantially constant. That is, the impurity concentration of aluminum in the silicon of the region 30 is approximately $2 \times 10^{19}$ atoms per cubic centimeter. An added benefit of this process is that the migration of the melt through the body provides a zone refining process for the material of the body. As a result, the material is cleansed of impurities and some defects during the process.

In silicon having crystallographic structure orientation other than $<111>$, the molten interface 28 of the migrating aluminum-silicon melt is very irregular. If the deviation from the $<111>$ growth axis be too great, the migrating interface 28 breaks up and results in a highly irregular P-N junction in the body 10 and a power diode of undesirable electrical characteristics. However, when the thermomigration is maintained substantially along the $<111>$ axis, the temperature gradient zone melting process continues with a substantially uniform molten interface 28 until all of the body 10 is converted to an aluminum-doped region 30 of recrystallized silicon material of the body 10. The excess aluminum is removed from the surface 14 upon completion of the process. The completed power diode structure is illustrated in FIG. 5.

Referring now to FIG. 6, there is shown the breaking up of the melt zone 17 which occurs when migration is not practiced substantially along the $<111>$ axis of the body 10. As stated heretofore, the migration of the zone 17 must proceed normal to the natural solid facet plane of the semiconductor metal liquid system. The planar melt zone 17 is therefore bounded by the facet plane. When migration proceeds oblique of the facet plane, the zone 17 breaks up into various sizes of droplets 19. The larger of the droplets 19 migrate faster than the next largest size droplets. Experience has shown that usually all of the larger droplets, ranging from 100 microns in diameter upward, are migrated out of the body 10 during the process. The next largest group of droplets ranging in size from 100 to 10 microns in diameter do not migrate as fast and some of them, 21, remain behind as metal inclusions upon completion of migration of the zone 17. However, droplets no larger than about 10 microns in diameter do not migrate, or migrate so slowly as to have almost no movement, and consequently remain behind in the region 30 as metal inclusions. These metal inclusions are defects which affect the operating characteristics of the completed diode.

With reference to FIG. 7, there is shown a condition which occurs when the planar melt zone 17 is greater than about 20 microns in thickness. The front face 28 of the planar zone 17 remains intact. However, because of thermal gradient and mass transport of melt through the body 10, the zone 17 encounters intrinsic instability and the rear face 29 becomes serrated. Eventually, the rear face 29 disintegrates and forms droplets 19 which acts as previously described in relation to the FIG. 6. These droplets which become entrapped in the region 30 become metal inclusions upon solidification and are defects which affect the operating characteristics of the completed device.

For a more detailed description of the process and the apparatus employed in the migration of selected dopant materials through a body of semiconductor mateereial, including for example, the migration of aluminum in silicon, one is directed to our following copending U.S. Patent applications filed on the same day as this U.S. Patent application and assigned to the same assignee as our present application: Method of Making Deep Diode Devices, Ser. No. 411,150, now U.S. Pat. No. 3,901,736; High Velocity Thermal Migration Method of Making Deep Diodes, Ser. No. 411,021, now U.S. Pat. No. 3,910,801; Deep Diode Devices and Method and Apparatus, Ser. No. 411,001 now abondoned; High Velocity Thermomigration Method of Making Deep Diodes, Ser. No. 411,015 now U.S. Pat. No. 3,898,106; Deep Diode Device and Method, Ser. No. 411,009 now U.S. Pat. No. 3,902,925; and Stabilized Droplet Method of Making Deep Diodes Having Uniform Electrical Properties, Ser. No. 411,008, now U.S. Pat. No. 3,899,361.

Figure 8:
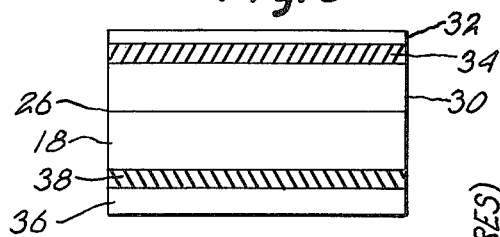

Referring now to FIG. 8, a first electrical contact 32 is affixed to the region 30 by a suitable ohmic solder layer 34. The diode is completed by affixing a second electrical contact 36 to the body 18 by a suitable layer 38 of ohmic solder material.

Large area power diodes prepared in the manner heretofore described achieve excellent electrical characteristics without the necessity of providing passivating coatings on exposed surfaces of the devices, including the exposed surfaces of the P-N junction. The resulting P-N junctions upon completion of processing are clean and very definitive. An abrupt, step P-N junction is present. The breakdown voltage of diodes made in accordance with the teachings of this invention achieves substantially the theoretical breakdown voltage which is obtainable for the semiconductor material of the bodies 10 and 18 employed and the dopant material comprising the layer 16. The leakage current of the prepared diode devices is excellent when compared to prior art devices.

The following examples are illustrative of the teachings of this invention:

EXAMPLE I

Two wafers of silicon single crystal series conductor material, each being one centimeter in thickness, were cut from a rod one inch in diameter. The silicon material of the rod was of N-type conductivity being phosphorous doped and being of 10 ohm-centimeter resistivity, 50 microsecond lifetime, < 111 > crystallographic orientation with $1 \times 10^3$ dislocations per square centimeter. Each wafer was prepared in the usual manner of polishing and lapping for semiconductor process work. A layer of aluminum metal 10 microns in thickness was deposited on one major surface of (111) planar orientation of one wafer by electron beam vapor deposition. The purity of the aluminum metal was 99.9999%. Deposition of the aluminum was practiced at a pressure of $1 \times 10^{-5}$ torr and required 50 minutes to deposit the layer of aluminum. No special preparation was practiced to protect the sides and other major surface of the wafer since they were shielded by the type of apparatus employed.

The two wafers were then disposed relative to each other as shown in FIG. 2 to form the workpiece "sandwich". The sandwich was disposed in apparatus suitable for practicing thermal gradient zone melting. The heat source was a molybdenum disk heated by an electron beam apparatus. The cold source, or heat sink, was a water-cooled copper disk. A calculated temperature gradient of 100°C per centimeter was established in the silicon material of the semiconductor sandwich substantially aligned with the < 111 > axis of the wafers by heating the molybdenum disk to a temperature sufficient to heat the major surface of the wafer closest to the molybdenum disk to 1090°C ± 20°C and maintaining it thereat. The temperature of the water cooled copper disk was maintained at 25°C ± 5°C. The process was practiced at a pressure of $1 \times 10^{-5}$ torr for two hours. The aluminum layer was not migrated entirely through the body of silicon.

Upon completion of the process, the sandwich was removed, sectioned, and examined in infrared transmission. The two wafers had been physically joined together. The P-N junction produced by the thermal gradient zone melting process had an extremely sharp junction profile. The aluminum-silicon migration had progressed a distance of 3 millimeters into the wafer from the surface upon which the aluminum had been deposited.

A sample diode 6.8 millimeters × 15 millimeters was cut from the processed sandwich and subjected to electrical testing. The P-N junction area was calculated to be 5 square millimeters. The breakdown voltage of the sample diode was 400 volts. This is the theoretical voltage which can be achieved for 10 ohm-centimeter N-type silicon doped with aluminum wherein the impurity concentration therein is approximately $2 \times 10^{19}$ atoms per cubic centimeter and the recrystallized semiconductor material has a resistivity of about $8 \times 10^{-3}$ ohm-centimeter. The current leakage at 10 volts was $3 \times 10^{-8}$ amperes. At 100 volts, the current leakage was $1 \times 10^{-7}$ amperes. The width of the P-N junction was determined by capacitance versus voltage measurements. The P-N junction profile of the P-N junction formed by the initial aluminum layer and the uncoated silicon wafer was one-third of a micron in width. Very little diffusion of aluminum into silicon across the P-N junction had occurred during the process. The lifetime of the processed body "sandwich" material was 1 microsecond. This process was carried on under non-clean room conditions.

Figure 9:
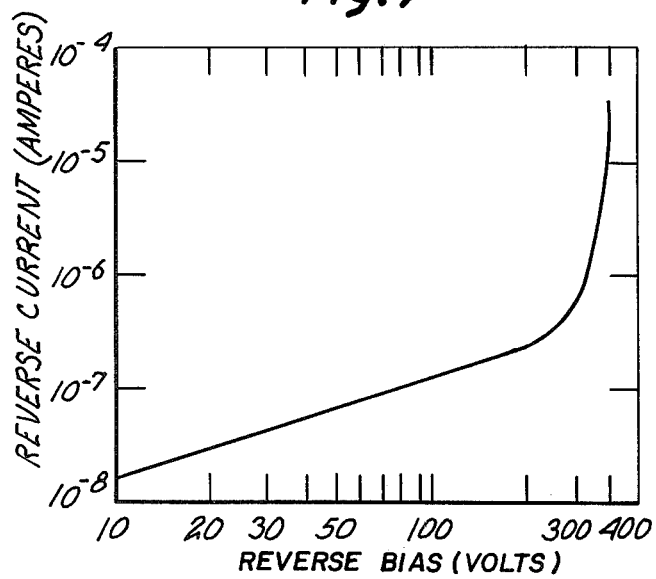
FIG. 9 is a graph of reverse current in amperes vs. reverse bias in volts of a semiconductor power diode made in accordance with the teachings of this invention.

A graph of the reverse current in amperes versus the reverse bias in volts of a sample having a 3 square millimeter P-N junction area of the above sample is shown in FIG. 9.

The diode as prepared has excellent electrical characteristics for both the breakdown voltage and the current leakage requirements. As noted, these achievements were obtained without any special surface passivation means being employed for the processed example and without employing clean room conditions.

EXAMPLE II

The process of Example I was repeated except that the material of each of the wafers had a < 100 > crystallographic orientation. The established thermal gradient was substantially aligned with the < 100 > axis of the wafers.

Examination of the P-N junction formed by the migrating interface showed the interface to be highly irregular in shape. Such a device is unreliable for a large area high power diode device. However, low power diodes can by manufactured from the processed "sandwich" by trimming back the sandwich to remove the irregular interface.

Large area power diodes prepared by the process of this invention exhibit extremely sharp junction profiles. That is, a step P-N junction is obtained. Very little diffusion of the aluminum into the silicon from across the P-N junction occurs in the process of this invention. The width of the P-N junction is approximately one-third micron for a process temperature range of from 700°C to approximately 1000°C. The lifetime of large area power diodes of this invention when prepared under clean room conditions are superior to the lifetime of prior art devices.

Figure 10:
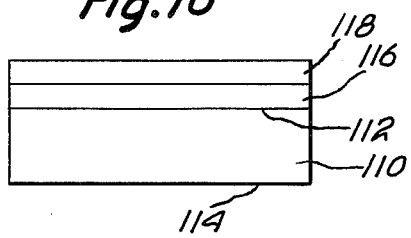
FIGS. 10, 11 and 12 are elevation views of a body of semiconductor material being processed by an alterenate method in accordance with the teachings of this invention.

An alternate method of making a high power diode embodies primarily vapor deposition techniques for both the semiconductor material and its dopant material. Referring now to FIG. 10, a body 110 of semiconductor material is prepared by suitable means such, for example, as by lapping and polishing for vapor deposition of metal thereon. The body 110 has a top surface 112 and a bottom surface 114. The material of the body 110 may be silicon, germanium, silicon carbide, gallium arsenide, a compound of a Group II element and a Group VI element and a compound of a Group III element and a Group V element. In order to describe the invention more specifically, the body 112 will be described as being of silicon semiconductor material having N-type conductivity.

A layer 116 of metal of from at 1 micron to about 20 microns is deposited on the surface 112 by such suitable means, as by vapor deposition, electron beam, and the like, wherein the layer of metal deposited will be substantially oxygen and defect free. The material of the layer 116 is one that will easily wet the surface of the semiconductor material that it comes in contact with during the initial period of heating of the thermal gradient zone melting process. In addition, the material of the layer 116 comprises at least one metal suitable for doping semiconductor material for producing a desired P-type, N-type conductivity or intrinsic conductivity. A suitable material for comprising the layer 116 is aluminum when the body 110 is silicon of N-type conductivity.

A layer 118 of semiconductor material is deposited on the layer 116 of metal. The semiconductor material may be the same as that of, or be any of the other materials suitable for comprising, the body 110. The material of the layer 118 may be deposited by any suitable means such, for example, as by vapor phase deposition or by depositing the material in powder form on the surface of the layer 116. The layer 118 should preferably be of the same thickness as that thickness of the layer 116 of metal to prevent the molten metal layer from penetrating the layer 118 in one or more locations prior to the remainder of the molten layer. This prevents the possibility of having faulty devices resulting from the process. Since the thickness of the layer 118 is most usually small, in the order of up to 10 or 20 microns, orientation of the crystallographic structure of the layer 118 is not critical. In this example, the layer 118 is said to be of polycrystalline silicon.

Figure 11:
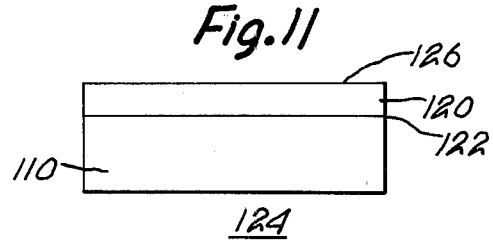

With reference to FIG. 11, the body 110, as processed, is placed in a suitable thermal gradient zone melting process apparatus as previously described, the layer 116 of aluminum becomes molten and forms a melt of aluminum-rich silicon with silicon of the surface 112 of the body 110 and the immediately adjacent silicon of the layer 118. As the thermal gradient zone melting process proceeds, a region 120 of recrystallized silicon of the layer 118 containing solid solubility of aluminum therein is produced having the same crystal structure orientation as that of the body 110. The impurity concentration of the region 120 is approximately $2 \times 10^{19}$. A P-N junction 122 is formed by the contiguous surfaces of the region 120 and the body 110 of P-type and N-type conductivity respectively. The excess molten aluminum which has migrated through the layer 118 appears on the surface 126 of the completed device 124 and is solidified thereon. The excess layer of aluminum is removed by suitable means such, for example, as by selective etching and grinding.

Although the teachings of this invention has been directed toward the making of large area power diodes, other applications of the invention are feasible. For example, referring again to FIG. 5, the recrystallized region 30 may be $P^+$-type conductivity aluminum-doped silicon formed by the thermal gradient zone melting process on a body 18 of P-type silicon. In a like manner a recrystallized region 30 of $N^+$-type conductivity is formed on a body 18 of N-type conductivity.

Figure 12:
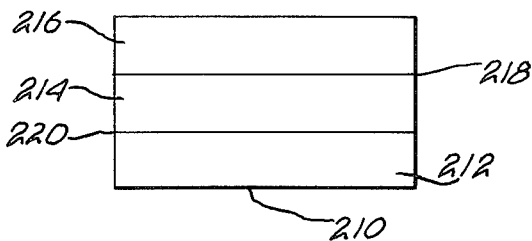

Referring now to FIG. 12, a semiconductor device 210 comprises three regions 212, 214 and 216 of semiconductor materials having different resistivities and the same of different type conductivity. For example, the region 212 may comprise N-type conductivity silicon, the region 214 $N^+$-type conductivity silicon and the region 216 $P^+$-type conductivity silicon. The interface 218 between the regions 214 and 216 is a P-N junction formed by the contiguous surfaces of the regions 214 and 216 of opposite type conductivity. The regions 214 and 216 are each formed from recrystallized bodies of semiconductor material of < 111 > crystallographic orientation like the body 10, and processed in the same or similar manner as the body 10, to form the respective regions. Similarly, the device 210 may be of the configurations $N$-$P^+$-$N^+$, $P$-$P^+$-$N^+$ and $P$-$N^+$-$P^+$.

Similarly, the device 210 may be of a configuration wherein the region 214 is of N-type conductivity and each of the regions 216 and 212 are recrystallized bodies of semiconductor materials of $P^+$-type conductivity and initially of < 111 > crystallographic structure. P-N junctions are formed by the interfaces 218 and 220 of the respective pairs of the regions 214 and 216 and 214 and 212 of opposite type conductivity. The regions 212 and 216 are formed by the thermal gradient zone melting process of this invention and the regions 212 and 216 are derived from bodies of semiconductor material prepared in the same manner as the body 10 as hereintofore described. Other configurations of the device 210 prepared in this manner are as varied as the possibilities of the conductivities of the regions 212, 214 and 216. Since each of the regions 212, 214 and 216 may each be of N-type, $N^+$-type, P-type and $P^+$-type conductivity, the device 210 can be of any of configurations that is possible by varying the conductivities of the regions 212, 214 and 216 in accordance with design requirements. These various configurations offer excellent opportunities for further processing of the device 210 into multi-region semiconductor devices such, for example, as power transistors, semiconductor controlled rectifiers, bidirectional switches, and the like. The choice of semiconductor material for the regions 212, 214 and 216 in accordance with design requirements and the process requirements of this invention.

Alternatively, the device 210 may be fabricated by starting with a body of suitable semiconductor material for the region 214. The regions 212 and 216 may be obtained from vapor deposited layers of semiconductor material. Additionally, the region 216 or 212 may be obtained from vapor deposited semiconductor material. The other region 212 or 216 is obtained from a body of semiconductor material initially of < 111 > crystallographic structure.

The invention has been described relative to practicing thermal gradient zone melting in a negative atmosphere. However, it has been discovered that when each body of semiconductor material is a thin wafer of the order of 10 mils in thickness, the thermal gradient zone melting process may be practiced in an inert gas atmosphere of hydrogen, helium, argon and the like in a furnace having a positive atmosphere.

Alternately, thin wafers and thick bodies of semiconductor material may be processed in a positive atmosphere in apparatus embodying a source of radiant energy means.

We claim as our invention:

1. A process for making a semiconductor device comprising:
   a. selecting a first body of single crystal semiconductor material having top and bottom surfaces which are opposed major surfaces thereof and at least the top surface has a preferred crystal orientation corresponding to the natural solid-liquid facet plane thereof;
   b. vapor depositing a first layer of metal of a preferred thickness on the top surface of the first body and in intimate contact therewith;
   c. placing the first body in an abutting contact relationship with a second body of single crystal semiconductor material having top and bottom surfaces which are opposed major surfaces thereof wherein the layer of metal on the top surface on he first body is in an abutting contact relaionship with the top surface of the second body;
   d. heating the two bodies and the layer of metal to an elevated temperature sufficient to form a molten region of the metal of the layer and the semiconductor material of the two bodies in contact therewith, the molten region having a preferred thickness not greater than about 20 microns in thickness;
   e. establishing a thermal gradient substantially along a preferred crystallographic axis of the first body which is normal to the natural solid-liquid facet plane of the semiconductor metal liquid surface wherein the bottom surface of the first body is at the highest temperature;
   f. migrating the molten zone through the first body from the top to the bottom surfaces substantially along the preferred axis to form a first region of recrystallized material of a selected portion of the second body having solid solubility of the metal of the layer therein of the second body and to form a second region of recrystallized material of the second body having solid solubility of the metal layer therein, the solid solubility metal imparting a selected conductivity and a selected level of resistivity to the two regions, the first and second regions being integral with each other, substantially free of metal inclusions, and having the crystalline structure of the second body, and
   g. joining together the two bodies of semiconductor material by the integral regions of recrystallized semiconductor material.

2. The process of claim 1 wherein
the preferred thickness of the layer of metal is at least 1 micron and less than about 20 microns.

3. The process of claim 2 wherein
the preferred crystal orientation of the natural solid-liquid facet plane is (111), and
the preferred crystallographic axis of the first body is < 111 >.

4. The process of claim 3 wherein
the molten region has a preferred thickness of about 10 microns.

5. The process of claim 4 wherein
the semiconductor material of at least the first body is selected from the group consisting of silicon, silicon carbide, germanium and gallium arsenide.

6. The process of claim 5 wherein
the molten region has a preferred thickness of about 10 microns.

7. The process of claim 5 wherein
the temperature gradient is from approximately 50°C/cm to approximately 200°C/cm.

8. The process of claim 7 wherein
the molten region has a preferred thickness of about 10 microns.

9. The process of claim 7 wherein
the temperature gradient is approximately 100°C/cm.

10. The process of claim 9 wherein the elevated temperature is 1000°C ± 20°C.

11. The process of claim 7 wherein
the semiconductor material of the first body is silicon.

12. The process of claim 11 wherein
the semiconductor material of the second body is silicon of N-type conductivity, and the layer of metal includes at least aluminum, wherein
the regions of recrystallized semiconductor material have P-type conductivity, and including the process step following the migrating of the molten zone through the first body of
forming a P-N junction of the contiguous surfaces of the material of the second body and the integral regions of recrystallized semiconductor material.

13. The process of claim 12 wherein
the resistivity of the two bodies prior to the initiation of migration if 10 ohm-centimeter, and
the resistivity of the region of recrystallized semiconductor material is approximately $8 \times 10^{-3}$ ohm-centimeter.

14. The process of claim 7 wherein
the elevated temperature is from approximately 700°C to about 1400°C.

15. The process of claim 2 wherein
the temperature gradient is from approximately 50°C/cm to approximately 200°C/cm.

16. The process of claim 15 wherein
the elevated temperature is from approximately 700°C to about 1400°C.

17. The process of claim 1 wherein
the preferred crystal orientation of the natural solid-liquid facet plane is (111), and the preferred crystallographic axis of the first body is < 111 >.

18. The process of claim 17 wherein
the molten region has a preferred thickness of about 10 microns.

19. The process for making the semiconductor device of claim 1 including the additional process steps of:
   h. selecting a third body of single crystal semiconductor material having top and bottom surfaces which are opposed major surfaces thereof and at least the top surface has a preferred crystal orientation corresponding to the natural solid-liquid facet plane thereof;
   i. vapor depositing a second layer of metal of a preferred thickness on the top surface of the third body and in intimate contact therewith,
   j. placing the third body in an abutting contact relationship with the second body of single crystal semiconductor material wherein the layer of metal on the top surface of the third body is in an abutting contact relationship with the bottom surface of the second body;
   k. heating the bodies and the second layer of metal to an elevated temperature sufficient to form a molten region of the metal of the second layer and the semiconductor material of the second and third bodies in contact therewith, the molten region having a preferred thickness not greater than about 20 microns in thickness;
   l. establishing a thermal gradient substantially along a preferred crystallographic axis of the third body which is normal to the natural solid-liquid facet plane of the semiconductor metal-liquid surface wherein the bottom surface of the third body is at the highest temperature;
   m. migrating the molten zone through the third body substantially along the preferred axis of the third body to form a third region of recrystallized material of a second selected portion of the second body having solid solubility of the metal of the layer therein of the second body and to form a fourth region of recrystallized material of the third body having solid solubility of the metal of the layer, therein, the solid solubility metal imparting a selected conductivity and a selected level of resistivity to the third and fourth regions, the third and fourth regions being integral with each other, substantially free of metal inclusions, and having the crystalline structure of the second body, and
   n. joining together the two bodies of semiconductor material by the integral third and fourth regions of recrystallized semiconductor material.

20. The process of claim 19 wherein
the vapor deposited metal is substantially free of oxygen.

21. The process of claim 19 wherein
the preferred thickness of the layer of metal is at least 1 micron and less than about 20 microns.

22. The process of claim 21 wherein
the molten region has a preferred thickness of about 10 microns.

23. The process of claim 21 wherein
the preferred crystal orientation of the natural solid-liquid facet plane is (111), and
the preferred crystal lographic axis of the third body is < 111 >.

24. The process of claim 23 wherein
the molten region has a preferred thickness of about 10 microns.

25. The process of claim 23 wherein
the semiconductor material of at least the third body is selected from the group consisting of silicon, silicon carbide, germanium and gallium arsenide.

26. The process of claim 25 wherein
the molten region has a preferred thickness of about 10 microns.

27. The process of claim 25 wherein
the temperature gradient is from approximately 50°C/cm to approximately 200°C/cm.

28. The process of claim 27 wherein
the molten region has a preferred thickness of about 10 microns.

29. The process of claim 27 wherein
the semiconductor material of the third body is silicon.

30. The process of claim 29 wherein
the semiconductor material of the second body is silicon of N-type conductivity, and
the layer of metal includes at least aluminum, wherein
the third and fourth regions of recrystallized semiconductor material have P-type conductivity, and
including the process steps following the migrating of the molten zone through the third body of
forming a P-N junction by the contiguous surfaces of the material of the second body and the integral third and fourth regions of recrystallized semiconductor material.

31. The process of claim 27 wherein
the elevated temperature is from approximately 700°C to about 1400°C.

32. The process of claim 21 wherein
the temperature gradient is from approximately 50°C/cm to approximately 200°C/cm.

33. The process of claim 32 wherein
the elevated temperature is from approximately 700°C to about 1400°C.

34. The process of claim 19 wherein
the preferred crystal orientation of the natural solid-liquid facet plane is (111), and the preferred crystallographic axis of the third body is < 111 >.

35. The process of claim 34 wherein
the molten region has a preferred thickness of about 10 microns.

36. The process of claim 1 and further including
practicing the process steps after completing the process of claim 1 of
vapor depositing a second layer of metal on a prepared surface of the first body of single crystal recrystallized semiconductor material;
depositing a layer of semiconductor material on the second layer of metal, the thickness of the layer is at least the same as that of the second layer of metal;
heating at least the first body, the second layer of metal and the layer of semiconductor material to an elevated temperature sufficient to form a molten region of the metal and the recrystallized semiconductor material of the first body and the semiconductor material of the layer which are in abutting contact with the second layer of metal;
establishing a temperature gradient substantially along the normal to the prepared surface of the first body at least from the prepared surface upward through the two layers, wherein the layer of semiconductor material is at the higher temperature;

migrating the molten zone along the thermal gradient through the second layer to form a second region of recrystallized semiconductor material of a first selective portion of the first body of recrystallized semiconductor material having solid solubility of the metal of the second layer therein integral with a third region of recrystallized semiconductor material of the layer of semiconductor material having solid solubility of the metal of the second layer therein, the solid solubility metal imparting a selected type conductivity and a selected level of resistivity to the second and third regions, the second and third regions being substantially free of metal inclusions and having the crystalline structure of the body, and joining the layer of semiconductor material physically to the first body by the integral second and third regions of recrystallized semiconductor material.

37. The process of claim 1 wherein
the vapor deposited metal is substantially free of oxygen.

38. A process for making a semiconductor device comprising
 a. vapor depositing a first layer of metal on a prepared surface of a body of single crystal semiconductor material;
 b. depositing a second layer of semiconductor material on the layer of metal, the thickness of the second layer is at least the same as that of the first layer;
 c. heating the body, layer of metal and the layer of semiconductor material to an elevated temperature sufficient to form a molten region of the metal and the semiconductor material of the body and the semiconductor material of the layer which are in abutting contact with the layer of metal;
 d. establishing a temperature gradient substantially along the normal to the prepared surface of the body at least from the prepared surface upward through the two layers, wherein the second layer is at the higher temperature;
 e. migrating the molten zone along the thermal gradient through the second layer to form a first region of recrystallized semiconductor material of a first selective portion of the body having solid solubility of the metal of the first layer therein integral with a second region of recrystallized semiconductor material of the second layer having solid solubility of the metal of the first layer therein, the solid solubility metal imparting a selected type conductivity and a selected level of resistivity to the two regions, the first and second regions being substantially free of metal inclusions having the crystalline structure of the body, and
 f. joining the second layer physically to the body by the integral first and second regions of recrystallized semiconductor material.

39. The process of claim 38 wherein
the semiconductor material of at least the second layer is one selected from the group consisting of silicon, silicon carbide, germanium and gallium arsenide.

40. The process of claim 38 wherein
the material of the second layer is silicon material, and
the material of the first layer is aluminum.

41. The process of claim 40 wherein
the material of the body is silicon having N-type conductivity, and
the conductivity type of the recrystallized region is P-type.

42. The process of claim 38 and further including
 g. vapor depositing a third layer of metal on another prepared surface of the body;
 h. depositing a fourth layer of semiconductor material on the third layer, the thickness of the fourth layer being at least the same as that of the third layer;
 i. heating the body, the third layer of metal and the fourth layer of semiconductor material to an elevated temperature sufficient to form a molten region of the metal and the semiconductor material of a second portion of the body and the semiconductor material of the fourth layer which are in abutting contact with the third layer of metal;
 j. establishing a temperature gradient substantially along the normal to the prepared surface of the body at least from the prepared surface upward through the two layers, wherein the fourth layer is at the higher temperature;
 k. migrating the molten zone along the thermal gradient through the fourth layer to form a third region of recrystallized semiconductor material semiconductor material of the second selective portion of the body having solid solubility of the metal of the third layer therein integral with a fourth region of recrystallized semiconductor material of the fourth layer having solid solubility of the metal of the third layer therein, the solid solubility metal imparting a selected conductivity and a selected level of resistivity to the two regions, the first and second regions being substantially free of metal inclusions having the crystalline structure of the body, and
 l. joining the fourth layer physically to the body by the integral third and fourth regions of recrystallized semiconductor material.

43. The process of claim 38 wherein
the temperature gradient is approximately 100°C/cm.

44. The process of claim 43 wherein
the elevated temperature is 1000°C ± 20°C.

45. The process of claim 38 wherein
the vapor deposited metal is substantially free of oxygen.

* * * * *